US007014982B2

(12) United States Patent
Thackeray et al.

(10) Patent No.: US 7,014,982 B2
(45) **Date of Patent: *Mar. 21, 2006**

(54) ANTIHALATION COMPOSITIONS

(75) Inventors: James W. Thackeray, Braintree, MA (US); George W. Orsula, Avon, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/832,651

(22) Filed: Apr. 26, 2004

(65) Prior Publication Data

US 2004/0202959 A1 Oct. 14, 2004

Related U.S. Application Data

(60) Continuation of application No. 10/335,476, filed on Dec. 31, 2002, now Pat. No. 6,773,864, which is a continuation of application No. 10/163,920, filed on Jun. 6, 2002, now Pat. No. 6,528,235, and a division of application No. 09/924,045, filed on Aug. 7, 2001, now Pat. No. 6,472,128, which is a continuation of application No. 08/640,144, filed on Apr. 30, 1996, now Pat. No. 6,451,503, which is a continuation of application No. 07/792,482, filed on Nov. 15, 1991, now Pat. No. 6,165,697.

(51) Int. Cl.
*G03C 1/76* (2006.01)

(52) U.S. Cl. .................. 430/271.1; 430/325; 430/327; 430/330; 430/14; 430/18

(58) Field of Classification Search ............. 430/271.1, 430/325, 327, 330, 14, 18

See application file for complete search history.

(56) References Cited

U.S. PATENT DOCUMENTS

| | | | |
|---|---|---|---|
| 3,036,913 | A | 5/1962 | Burg |
| 3,287,152 | A | 11/1966 | Alles et al. |
| 3,778,413 | A | 12/1973 | Junger et al. |
| 4,060,656 | A | 11/1977 | Naka et al. |
| 4,141,733 | A | 2/1979 | Guild |
| 4,299,938 | A | 11/1981 | Green et al. |
| 4,341,859 | A | 7/1982 | Keane et al. |
| 4,362,809 | A | 12/1982 | Chen et al. |
| 4,370,405 | A | 1/1983 | O'Toole et al. |
| 4,401,749 | A | 8/1983 | Hoffmann et al. |
| 4,413,052 | A | 11/1983 | Green et al. |
| 4,429,034 | A | 1/1984 | Keane et al. |
| 4,459,348 | A | 7/1984 | Jun et al. |
| 4,487,889 | A | 12/1984 | Craun |

(Continued)

FOREIGN PATENT DOCUMENTS

DE 278 691 5/1990

(Continued)

OTHER PUBLICATIONS

Elliott, "Integrated Circuit Fabrication Technology", McGraw Hill Book Col, 1982 pp. 259, 263-275 and 305-309.

(Continued)

*Primary Examiner*—Mark A. Chapman
(74) *Attorney, Agent, or Firm*—Peter F. Corless; Edwards Angell Palmer & Dodge LLP

(57) ABSTRACT

Antihalation compositions and methods for reducing the reflection of exposure radiation of a photoresist overcoated said compositions. The antihalation compositions of the invention comprise a resin binder and material capable of causing a thermally induced crosslinking reaction of the resin binder.

13 Claims, 1 Drawing Sheet

STEP A
STEP B
STEP C
STEP D
(STEP E') STEP E (STEP E")
STEP F

U.S. PATENT DOCUMENTS 4,576,898 A 3/1986 Hoffmann et al.
4,702,992 A * 10/1987 Ishii et al. ............... 430/272.1
4,719,166 A 1/1988 Blevins et al.
4,764,561 A 8/1988 Kiss et al.
4,822,718 A 4/1989 Latham et al.
4,840,874 A 6/1989 Shigemitsu et al.
4,860,062 A 8/1989 Parks
4,863,827 A 9/1989 Jain et al.
4,885,232 A 12/1989 Spak
4,910,122 A 3/1990 Arnold et al.
4,921,778 A 5/1990 Thackeray et al.
4,981,530 A 1/1991 Clodgo et al.
5,019,481 A 5/1991 Ito
5,089,374 A 2/1992 Saeva
5,100,503 A 3/1992 Allman et al.
5,139,918 A 8/1992 Goel
5,206,116 A 4/1993 Daniels et al.
5,219,788 A 6/1993 Abernathey et al.
5,693,691 A 12/1997 Flaim et al.
5,851,730 A 12/1998 Thackeray et al.
5,851,738 A 12/1998 Thackeray et al.
6,165,697 A 12/2000 Thackeray et al.
6,190,839 B1 2/2001 Pavelchek et al.
6,261,743 B1 7/2001 Pavelchek et al.
6,316,165 B1 11/2001 Pavelchek et al.
6,368,768 B1 4/2002 Jung et al.
6,472,128 B1 10/2002 Thackeray et al.
6,528,235 B1 3/2003 Thackeray et al.
2002/0031729 A1 3/2002 Trefonas et al.
2002/0195419 A1 12/2002 Pavelchek

FOREIGN PATENT DOCUMENTS

EP 0 501 178 9/1992
WO WO 90/03598 4/1990

OTHER PUBLICATIONS

Lamola et al., "Chemically Amplified Resists", Solid State Technology, Aug. 1991, pp. 53-60.

* cited by examiner

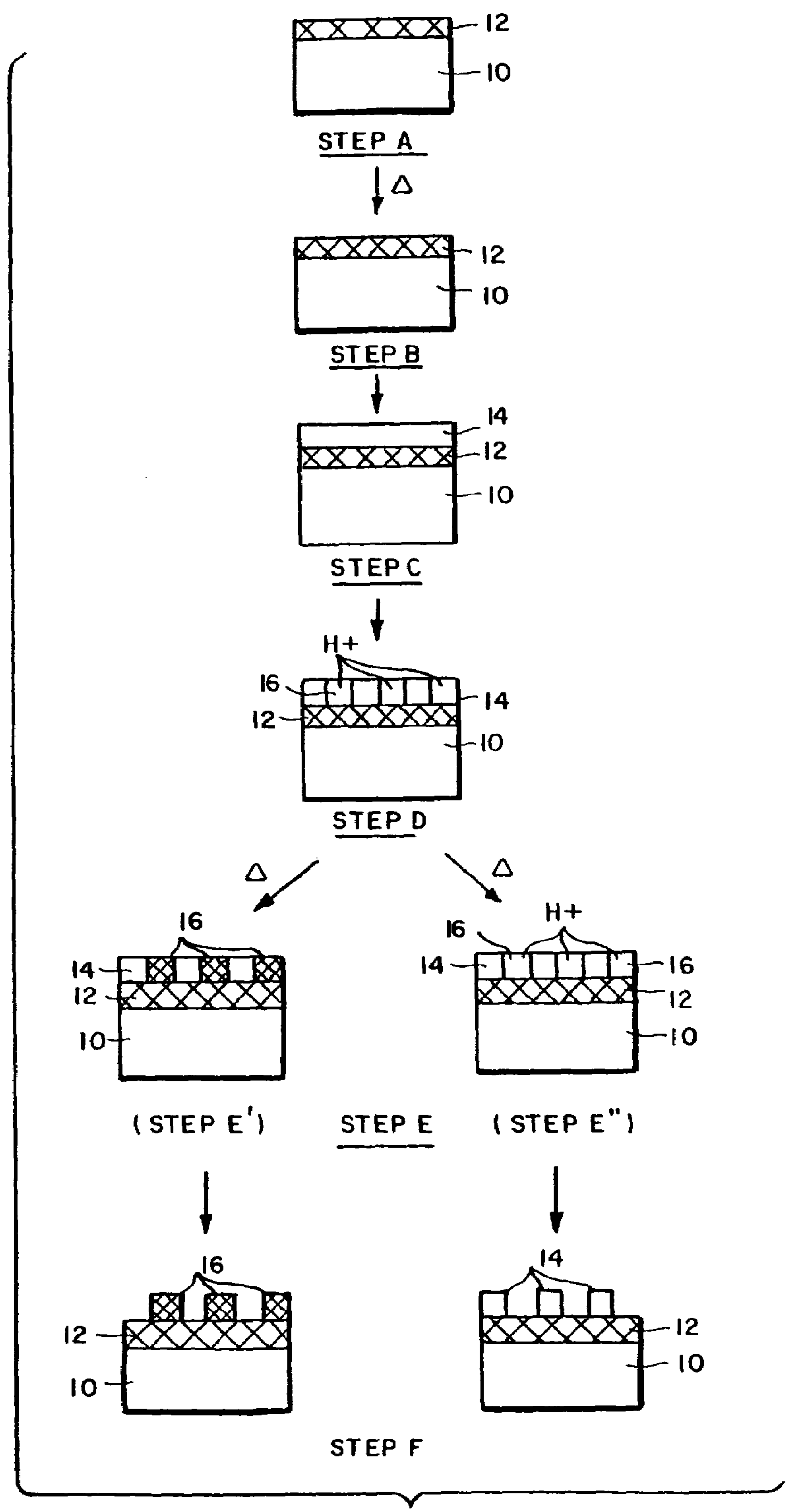
FIG.

ANTIHALATION COMPOSITIONS

This application is a continuation of application(s) application number 10/335,476 filed Dec. 31, 2002 now U.S. Pat. No. 6,773,864 which application is a Continuation of application number 10/163,920 filed on Jun. 6, 2002 now U.S. Pat. No. 6,528,235 which application is a Divisional Application of application Ser. No. 09/924,045 filed on Aug. 7, 2001 now U.S. Pat. No. 6,472,128 which application is a Continuation of application Ser. No. 08/640,144 filed Apr. 30, 1996 now U.S. Pat. No. 6,451,503 which application is a Continuation of application Ser. No. 07/792,482, filed on Nov. 15, 1991 now U.S. Pat. No. 6,165,697.

BACKGROUND OF THE INVENTION

1. Field of the Invention

The present invention relates to compositions that reduce the reflection of exposure radiation from a substrate back to an overcoated resist layer. More particularly, the invention relates to an antihalation composition characterized in one aspect by containing a thermally activated crosslinking agent.

2. Background Art

Photoresists are used for transfer of an image to a substrate. A coating layer of a photoresist is formed on a substrate, and the resist layer is then selectively exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the resist coated substrate. Following exposure, the photoresist is developed to provide a relief image that permits selective processing of the substrate.

A photoresist can be either positive-acting or negative-acting. For most negative photoresists, those coating layer portions that are exposed to activating radiation polymerize or crosslink in a reaction between a photoactive compound and polymerizable reagents of the resist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. The background of photoresists are described by Deforest, *Photoresist Materials and Processes*, McGraw Hill Book Company, New York, ch. 2, 1975, and by Moreay, *Semiconductor Lithography, Principles, Practices and Materials*, Plenum Press, New York, ch. 2 and 4, both incorporated herein by reference for their teaching of photoresists and methods of making and using same.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of the activating radiation used to expose a photoresist often poses notable limits on resolution of the image patterned in the resist layer. Reflection of radiation from the substrate/resist interface can produce variations in the radiation intensity in the resist during exposure, resulting in non-uniform photoresist linewidth upon development. Radiation also can scatter from the substrate/resist interface into regions of the resist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasimonochromatic radiation is commonly used in resist projection techniques. Due to radiation reflection at the resist/substrate interface, however, constructive and destructive interference is particularly significant when monochromatic or quasi-monochromatic radiation is used for photoresist exposure. In such cases the reflected light interferes with the incident light to form standing waves within the resist. In the case of highly reflective substrate regions, the problem is exacerbated since large amplitude standing waves create thin layers of underexposed resist at the wave minima. The underexposed layers can prevent complete resist development causing edge acuity problems in the resist profile. The time required to expose the photoresist is generally an increasing function of resist thickness because of the increased total amount of radiation required to expose an increased amount of resist. However, because of the standing wave effect, the time of exposure also includes a harmonic component which varies between successive maximum and minimum values with the resist thickness. If the resist thickness is non-uniform, the problem becomes more severe, resulting in variable linewidth control.

Variations in substrate topography also give rise to resolution-limiting reflection problems. Any image on a substrate can cause impinging radiation to scatter or reflect in various uncontrolled directions, affecting the uniformity of resist development. As substrate topography becomes more complex with efforts to design more complex circuits, the effects of reflected radiation become more critical. For example, metal interconnects used on many microelectronic substrates are particularly problematic due to their topography and regions of high reflectivity.

Such radiation reflection problems have been addressed by the addition of certain dyes to photoresist compositions, the dyes absorbing radiation at or near the wavelength used to expose the photoresist. Exemplary dyes that have been so employed include the coumarin family, methyl orange and methanil yellow. Some workers have found that use of such dyes can limit resolution of the patterned resist image.

Another approach has been to use a radiation absorbing layer interposed between the substrate surface and the photoresist coating layer. See, for example, PCT Application WO 90/03598, and U.S. Pat. Nos. 4,910,122, 4,370,405 and 4,362,809, all of which are incorporated herein by reference for their teaching of antireflective (antihalation) compositions and use of the same. At least some prior antireflective coatings, however, suffer from poor adhesion to the overcoated photoresist layer and/or the underlying substrate surface. Such adhesion problems can severely compromise the resolution of the patterned photoresist image.

Thus, it would be desirable to have an antihalation coating composition that absorbs significantly incident and reflective exposure radiation, and that provides substantial standing wave attenuation. It would be further desirable to have an antihalation composition that can be coated on a microelectronic substrate and adhere well to both a subsequently applied photoresist coating layer and the underlying substrate surface.

SUMMARY OF THE INVENTION

The present invention provides an antihalation composition suitable for use with a photoresist, the antihalation composition in general comprising a resin binder and a compound capable of causing a thermally induced crosslinking reaction of the resin-binder. Components of the antihalation composition preferably can crosslink with an overcoated layer of the photoresist composition, thereby increasing adhesion between the two coating layers and avoiding notable problems of at least some prior antireflective systems. The antihalation compositions of the invention may further comprise an acid or acid generator compound to catalyze the reaction between the resin binder and the crosslinking compound, enabling the crosslinking reaction to proceed at relatively lower temperatures. As used herein, the term acid generator refers to a compound that generates an acid upon appropriate treatment of the compound, for example, upon exposure to activating radiation or thermal treatment. The thermally active crosslinker can be a variety of materials and, preferably, is an amine-based material such as a benzoguanamine-based or melamine-based resin. To enhance radiation absorption properties, the antihalation compositions of the invention may further include one or more dye compounds that absorb radiation at or near the exposure wavelength of the overcoated photoresist.

The invention further provides a method for application and use of the antihalation coating composition with a photoresist. Thus, in a preferred aspect, a method is provided comprising (a) applying a layer of an antihalation composition of the invention on a substrate; (b) at least partially curing the antihalation coating layer; (c) applying a layer of a photoresist on the coated substrate; (d) exposing selected portions of the photoresist layer; (e) baking the applied antihalation and photoresist coating layers; and (f) developing the exposed photoresist layer. When a suitable photoresist is employed, baking of the two coating layers results in crosslinking between components of the antihalation and photoresist compositions, thereby providing excellent adhesion between the two coating layers. It has also been found that the antihalation compositions of the invention adhere well to substrate surfaces, including substrates used in microelectronic applications.

The invention further provides methods for forming a relief image and novel articles of manufacture consisting of substrates coated with an antihalation composition of the invention alone or in combination with a photoresist composition. In particular, a coated substrate is provided, the substrate having an antihalation composition of the invention coated thereon, and a photoresist coated over said antihalation composition, the photoresist comprising a resin binder and a radiation sensitive component.

BRIEF DESCRIPTION OF THE DRAWING

The FIGURE illustrates schematically processes of the invention.

DETAILED DESCRIPTION OF THE INVENTION

A preferred antihalation composition of the invention comprises a mixture of materials that will crosslink, cure or harden upon thermal treatment. More particularly, a preferred composition comprises a resin binder and a material capable of undergoing a thermally induced crosslinking reaction with said resin binder. Preferably the resin binder and the thermal crosslinking compound are materials which, in an uncured state, are soluble in a nonreactive solvent or solvent mixture and are capable of forming a homogeneous, nontacky, adherent film on a substrate surface onto which it is applied.

A particularly preferred antihalation composition comprises an amine-based thermal crosslinker and a phenol-based resin binder. Suitable amine-based thermal crosslinkers include melamine-formaldehyde resins, glycoluril-formaldehyde resins, and urea-based resins. Suitable melamine resins include the melamine resins manufactured by American Cyanamid Company of Wayne, N.J. and sold under the trade names Cymel$^R$ 300, 301, 303, 350, 370, 380, 1116 and 1130. Suitable glycoluril resins include those sold by the American Cyanamid Company under the trade names of Cymel$^R$ 1170, 1171, 1172. Suitable urea-based resins include those sold by the American Cyanamid Company under the trade names of Beetle$^R$ 60, 65 and 80. A particularly preferred amine-based crosslinker is a benzoguanamine-based material, including the benzoguanamine resins sold by the American Cyanamid Company under the trade names of Cymel$^R$ 1123 and 1125. Additionally, combinations of the above amine-based crosslinkers will be suitable, including combinations that comprise a benzoguanamine-based material. In addition to the above resins available from the American Cyanamid Company, a large number of similar resins are commercially available from other suppliers. Additionally, such amine-based resins may be prepared by the reaction of acrylamide or methacrylamide copolymers with formaldehyde in an alcohol-containing solution, or alternatively by the copolymerization of N-alkoxymethyl acrylamide or methacrylamide with other suitable monomers. The crosslinker component of the antihalation compositions of the invention in general are used in an amount of between about 5 and 50 weight percent of total solids of the composition, more typically in amount of 30 weight percent of total solids of the composition.

As noted above, the amine-based crosslinker compound of the antihalation composition is preferably used in combination with a phenol-based resin binder. Suitable phenol-based resin binders include, for example, novolak resins; poly(vinylphenols) and copolymers of the same with styrene, alpha-methylstyrene; acrylic resins; polyglutarimides; polyacrylic acid or polymethacrylic acid copolymers; alkali-soluble polyacrylamides and polymethacrylamide copolymers; copolymers containing 2-hydroxyethylmethacrylate and 2-hydroxypropylmethacrylate; polyvinyl alcohols such as those prepared from partially hydroxylated polyvinyl acetates; alkali-soluble styrene-allyl alcohol copolymers; and mixtures thereof.

Of the above, poly(vinylphenol) and its copolymers and novolak resins containing hydroxyl groups and sites for the electrophilic substitution of aromatic rings at positions ortho- or para-relative to the hydroxyl group are preferred. Novolak resins that are useful in conjunction with amine-based resins in the acid hardening resin system are alkali-soluble film forming phenolic resins having a molecular weight (weight average) ranging from about 300 to about 100,000 daltons, and preferably from about 1000 to 20,000 daltons. These novolak resins may be prepared by the condensation reaction of a phenol, a naphthol or a substituted phenol, such as, cresol, xylenol, ethylphenol, butylphenol, oxypropyl methoxyphenol, chlorophenol, bromophenol, resorcinol, naphthol, chloronaphthol, bromonaphthol or hydrocuinone with formaldehyde, acetaldehyde, benzaldehyde, furfural acrolein, or the like. Blends of suitable novolak resins may also be used in order to adjust the dissolution rate of the exposed coating in aqueous base solutions as well as for adjusting the viscosity, hardness and other physical properties of the coating. Suitable novolak resins are disclosed in numerous patents including U.S. Pat. Nos. 3,148,983; 4,404,357; 4,115,128; 4,377,631; 4,423,138; and 4,424,315, the disclosures of which are incorporated by reference herein.

Poly(vinylphenols) are thermoplastic materials that may be formed by block polymerization, emulsion polymerization or solution polymerization of corresponding monomers in the presence of a cationic catalyst. Vinylphenols used for the production of poly(vinylphenol) resins may be prepared, for example, by hydrolysis of commercially available coumarins or substituted coumarins, followed by decarboxylation of the resulting hydroxy cinnamic acids. Useful vinyl phenols also may be prepared by dehydration of the corresponding hydroxy alkyl phenol or by decarboxylation of hydroxy cinnamic acids resulting from the reaction of substituted or non-substituted hydroxy benzaldehydes with malonic acid. Preferred poly(vinylphenol) resins prepared from such vinyl phenols have a molecular weight range of from about 2,000 to about 100,000 daltons. Procedures for the formation of polyvinylphenol) resins can be found in U.S. Pat. No. 4,439,516, incorporated herein by reference.

Another suitable phenol-based resin binder for use in the antihalation compositions of the invention are copolymers of phenolic units and cyclic alcohol units analogous in structure to novolak resins and poly(vinylphenol) resins. Such copolymers are described in U.S. patent application Ser. No. 07/354,800, incorporated herein by reference. These copolymers may be formed in several ways. For example, in the conventional preparation of a poly(vinylphenol) resin, a cyclic alcohol may be added to the reaction mixture as a comonomer during the polymerization reaction which is thereafter carried out in a normal manner. The cyclic alcohol is preferably aliphatic, but may contain one or two double bonds. The cyclic alcohol is preferably one closest in structure to the phenolic unit. For example, if the resin is a poly(vinylphenol), the comonomer would be vinyl cyclohexanol.

The preferred method for formation of the copolymer comprises hydrogenation of a preformed poly(vinylphenol) resin. Hydrogenation may be carried cut using art recognized hydrogenation procedures, for example, by passing a solution of the phenolic resin over a reducing catalyst such as a platinum or palladium coated carbon substrate or preferably over Raney nickel at elevated temperature and pressure. The specific conditions are dependent upon the polymer to be hydrogenated. More particularly, the polymer is dissolved in a suitable solvent such as ethyl alcohol or acetic acid, and then the solution is contacted with a finely divided Raney nickel catalyst at a temperature of from about 100 to 300° C. at a pressure of from about 50 to 300 atmospheres or more. The finely divided nickel catalyst may be a nickel-on-silica, nickel-on-alumina, or nickel-on-carbon catalyst depending on the resin to be hydrogenated.

Another suitable resin binder for the antihalation compositions of the invention is a polymer comprising anthracene units. This polymer may contain other units such as carboxy and/or alkyl ester units pendant from the polymer backbone. In particular, a preferred resin binder has a structure of formula (I):

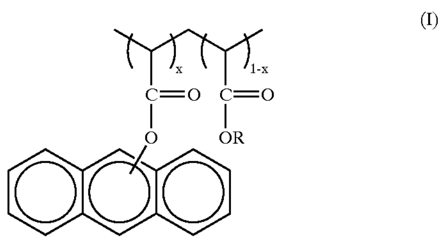

(I)

wherein R is a hydrogen or an alkyl group (e.g., an alkyl group having from 1 to 6 carbon atoms); and x is the mole fraction of anthracene ester units in the polymer, and wherein x is suitably a value of from 0.1 to 1.0. The anthracene groups may be unsubstituted or substituted at one or more available positions by substituents such as, for example, halo, alkoxy and alkyl. Suitably the anthracene moiety can be substituted to a carboxyl group at any available position of the anthracene ring, as shown above in formula (I). Preferably, the resin binder contains 9-anthracene ester units. These anthracene resin binders can be prepared, for example, by condensation of anthranol with methacryloyl chloride, followed by condensation of the vinyl anthracene ester reaction product to form the homopolymer, or condensation of the vinyl ester reaction product with other polymerizable compounds to form a mixed polymer.

For enhanced etch resistance of the antihalation composition, a silicon-containing material can be employed, such as poly(vinylsilsesquioxane) Such a silicon-containing resin can be used as the sole resin binder of the composition, or in combination with other resin binders, such as the phenolic resins described above.

The concentration of the resin binder component of the antihalation compositions of the invention may vary within relatively broad ranges, and in general the resin binder is employed in a concentration of from about 50 to 95 weight percent of the total of the dry components of the composition, more typically from about 60 to 80 weight percent of the total dry components.

As indicated above, the antihalation compositions of the invention may further comprise an acid or acid generator compound for catalyzing the crosslinking reaction between the resin binder and crosslinker compound. Preferably an acid generator compound is employed. Suitable acid generator compounds include compounds that liberate acid upon photolysis or thermal treatment. Preferably a thermal acid generator is employed, i.e., a compound that generates acid upon thermal treatment. A variety of known thermal acid generator compounds are suitably employed in the antireflective compositions of the invention such as, for example, 2,4,4,6-tetrabromocyclohexadienone, benzoin tosylate, 2-nitrobenzyl tosylate, and alkyl esters of organic sulfonic acids. Typically a thermal acid generator is present in an antihalation composition in concentration of from about 1 to 15 percent by weight of the total of the dry components of the composition, more preferably about 5 percent by weight of the total dry components. Photoacid generators may also be employed in an antihalation composition, for example onium salts, halogenated non-ionic photoacid generators such as 1,1-bis[p-chlorophenyl]-2,2,2-trichloroethane, and other photoacid generators disclosed herein for use in photoresist compositions. Suitable amounts of a photoacid generator in an antihalation composition in general range from about 1 to 15 percent by weight of the total of dry components of the composition. For an antihalation composition containing a photoacid generator, a coating layer of the composition is exposed to an effective amount of activating radiation to generate the photoacid, followed by a post-exposure bake at a temperature sufficient to at least partially cure the coating layer.

It should be appreciated that an antihalation composition of the invention can be non-photoimageable, e.g., by not employing an acid catalyst or employing a non-photoactive acid catalyst such as a thermal acid generator; or an antihalation composition can be rendered photoimageable (and hence developable) by incorporating an effective amount of a suitable photoacid generator into the composition and then exposing a coating layer of the composition through a photomask. Suitable photoacid generators include the nonionic halogeneted photoacid generators-as described herein.

Another optional additive of the compositions of the invention are compounds that serve as dyes and absorb radiation used to expose an overcoated photoresist layer. The dye should absorb well at the wavelength at which the overcoated photoresist is exposed and, therefore, selection of a suitable dye for a specific antihalation composition in large part will be determined by the particular photoresist that is employed. For example, if an antireflective composition is used in combination with a deep U.V. photoresist (i.e., a resist that is exposed at between 100 and 300 nm) the dye compound should strongly absorb in the deep U.V. region. Suitable dyes are known in the art and include, for example, the curcumin family and derivatives thereof, anthracene, anthrarobin, Sudan-orange, benzophenothiazine and naphthol-AS. Typically a dye is present in an antihalation composition in a concentration of from about 2 to 30 percent by weight of the total of the dry components of the composition, more preferably from 5 to 15 percent by weight of the total dry components.

Other optional additives include surface leveling agents, for example, the leveling agent available under the tradename Silwet 7604 from Union Carbide.

To make a liquid coating composition, the components of the antihalation composition are dissolved in a suitable solvent such as, for example, one or more of the glycol ethers such as 2-methoxyethyl ether (diglyme), ethylene glycol monomethyl ether, and propylene glycol monomethyl ether; N-methyl pyrrolidinone; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antihalation composition varies from about 1 to 50 weight percent of the total weight of the antihalation composition, preferably the solids content varies from about 5 to 35 weight percent of the total weight of the antihalation composition.

A variety of photoresist compositions can be employed with the antihalation compositions of the invention. Preferably, a photoresist is employed that, when coated over a film layer of antihalation composition, is capable of crosslinking with the antihalation composition at the interface of the two coating layers. More specifically, preferred photoresists for use with the antihalation compositions of the invention include positive-acting and negative-acting photoacid-generating compositions that comprise a resin system that can crosslink with one or more components of the antihalation composition.

A particularly preferred group of photoresists for use with the compositions of the invention comprise a radiation sensitive component such as a photoacid generator compound and a mixture of materials that will cure, crosslink or harden upon heating and exposure to acid. A preferred mixture comprises a phenol-based resin binder and an amine-based crosslinker. Suitable phenol-based resins include novolak resins, poly(vinylphenols) and various copolymers thereof. Suitable amine-based crosslinkers include those described above for the antihalation compositions, in particular the melamine-formaldehyde Cymel resins available from American Cyanamid. Suitable photoacid generator compounds include the onium salts, such as those disclosed in U.S. Pat. Nos. 4,442,197, 4,603,101, and 4,624,912, each incorporated herein by reference; and nonionic organic photoactive compounds such as the halogenated photoactive compounds disclosed in the below referenced European Patent Applications. These photoactive compounds should be present in a photoresist in an amount sufficient to enable development of a coating layer of the resist following exposure to activating radiation. Preferred negative-acting photoresists for use in accordance with the invention include the acid-hardening photoresists as disclosed, for example, in European Patent Applications Nos. 0401499 and 0423446, both incorporated herein by reference. As used herein, the term "acid-hardening photoresist" refers to photoresist compositions of the general type described above and in these referenced European Patent Applications.

Other preferred photoresists include positive-acting photoresists that contain components that can crosslink with one or more components of the antihalation compositions of the invention. Such photoresists suitably comprise a phenol-based resin binder in combination with a radiation sensitive component. Suitable resin binders include novolak resins, poly(vinylphenols) and various copolymers thereof. Suitable radiation sensitive components can comprise a variety of photoacid generator compounds including the naphthoquinone diazide sulfonic acid esters such as 2,1,4-diazonaphthoquinone sulfonic esters and 2,1,5-diazonaphthoquinone sulfonic acid esters; the onium salts; and other known acid generators such as those disclosed in European Patent Application Nos. 0164248 and 0232972, both incorporated herein by reference. In addition to "conventional" positive-acting resists, chemically amplified positive resists are particularly suitable for use with the antihalation compositions of the invention. As with the above described acid-hardening resists, a chemically-amplified positive resist generates a catalytic photoproduct upon exposure to activating radiation. In a positive system, this photoproduct (e.g., acid) renders the exposed regions of the resist more developer soluble, for example by catalyzing a deprotection reaction of one or more of the resist components to liberate polar functional groups such as carboxy. See, Lamola, et al., "Chemically Amplified Resists", *Solid State Technology,* 53–60 (August 1991), incorporated herein by reference.

Reference is now made to the FIGURE of the Drawing which shows a preferred method for use of an antihalation composition of the invention. In Step A, an antihalation composition is applied to substrate 10 to provide antihalation coating layer 12. The antihalation composition may be applied by virtually any standard means including spin coating. The antireflective composition in general is applied on a substrate with a dried layer thickness of between about 0.05 and 0.5 $\mu$m, preferably a dried layer thickness of between about 0.10 and 0.20 $\mu$m. The substrate is suitably any substrate conventionally used in processes involving photoresists. For example, the substrate can be silicon, silicon dioxide or aluminum—aluminum oxide microelectronic wafers. Gallium arsenide, ceramic, quartz or copper substrates may also be employed. Substrates used for liquid crystal display applications are also suitably employed, for example glass substrates, indium tin coated substrates and the like.

In Step B the antihalation layer is at least partially cured. Cure conditions will vary with the components of the antireflective composition. Thus, if the composition does not contain an acid catalyst, cure temperatures and conditions will be more vigorous than those of a composition containing an acid or acid generator compound. For example, for a composition containing a novolak resin binder and the benzoquanamine-formaldehyde resin Cymel 1123 as a crosslinker, typical cure conditions are heating at about 200° C. for about 30 minutes. If the thermal acid generator 2,4,4,6-tetrabromocyclohexadienone is added to this composition, cure temperatures of about 150° C. for about 30 minutes will be suitable for at least partially curing the composition coating layer. Cure conditions preferably render coating layer 12 substantially developer insoluble. Additionally, as discussed above, if the antihalation composition includes a photoacid generator, the composition coating layer can be at least partially cured by exposing the coating layer to an effective amount of activating radiation (e.g., between about 10 to 300 $mJ/cm^2$), followed by a post-exposure bake of from 50 to 140° C.

In Step C a photoresist is applied over the surface of the crosslinked antihalation layer 12. As with application of the antihalation composition, the photoresist can be applied by any standard means such as by spinning, dipping or roller coating. When spin coating, the solids content of the photoresist composition can be adjusted to provide a desired film thickness based upon the specific spinning equipment utilized, the viscosity of the solution, the speed of the spinner and the amount of time allowed for spinning. Following application, the photoresist coating layer 14 is typically dried by heating to remove solvent preferably until layer 14 is tack free. Optimally, no intermixing of the antihalation layer and photoresist layer should occur.

In Step D coating layer 14 is imaged with activating radiation through a mask in conventional manner. The exposure energy is sufficient to effectively activate the photoactive component of the radiation sensitive system to produce a patterned image 16 in coating layer 14 and, more specifically, the exposure energy typically ranges from about 10 to 300 $mJ/cm^2$, dependent upon the exposure tool.

Step E is an optional step and is employed if the photoresist requires post-exposure heating to create solubility differences between exposed and unexposed regions of a coating layer. For example, acid-hardening photoresists typically require post-exposure heating to induce the acid-catalyzed crosslinking reaction, as depicted in Step E'; and many chemically amplified positive-acting resists require post-exposure heating to induce an acid-catalyzed deprotection reaction as shown in Step E". Typically the coated substrate 10 is subjected to a post-exposure bake at temperatures of from about 50° C. or greater, more specifically a temperature in the range of from about 50° C. to 140° C.

In Step F, the exposed resist coating layer 14 is developed, preferably with an aqueous based developer such as an inorganic alkali exemplified by sodium hydroxide, potassium hydroxide, sodium carbonate, sodium bicarbonate, sodium silicate, sodium metasilicate, aqueous ammonia or the like. Alternatively, organic developers can be used such as choline based solutions; quaternary ammonium hydroxide solutions such as a tetra-alkyl ammonium hydroxide solution; various amine solutions such as ethyl amine, n-propyl amine, diethyl amine, di-n-propyl amine, triethyl amine or, methyldiethyl amine; alcohol amines such as diethanol amine or triethanol amine; cyclic amines such as pyrrole, piperidine, etc. In general, development is in accordance with art recognized procedures.

Following development, a final bake of an acid-hardening photoresist is often employed at temperatures of from about 100 to 150° C. for several minutes to further cure the developed exposed areas 16.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. In particular, a plasma gas etch readily penetrates the crosslinked antihalation coating layer.

It should be appreciated that the same removal chemistry can be employed to strip both an antihalation composition of the invention and many photoresists used, in combination therewith. For example, an acid-hardening photoresist used in combination with a preferred antihalation composition of the invention comprising a phenol-based resin binder and an amine-based crosslinker as described above, is readily stripped with a single stripper solution after selective substrate treatment. For removing such coating layers, a preferred stripper solution contains about 90 weight percent dimethylsulfoxide and 10 weight percent para-toluenesulfonic acid. Preferably this composition is used at about 70 to 90° C.

The following examples are presented to better illustrate the invention, but are not to be construed as limiting the invention to the specific embodiments disclosed. In the antihalation compositions disclosed in the examples, the novolak resin component was a formaldehyde-phenol condensate, the phenol component being 95 weight percent cresol and 5 weight percent ethylphenol, and the resin having a molecular weight (weight average) of about 11,000 daltons and a dispersity of about 20.

EXAMPLE 1

A preferred antihalation composition was prepared by mixing the components set forth below, with component amounts expressed as parts by weight:

| Component | Amount |
|---|---|
| Resin binder | |
| Novolak resin | 5.59 |
| Crosslinker material | |
| Hexamethoxymethylmelamine (obtained from American Cyanamid) | 1.67 |
| Thermal acid generator | |
| 2,4,4,6-tetrabromocyclohexadienone | 0.28 |
| Surface leveling agent | |
| Silwet 7604 (obtained from Union Carbide) | 0.015 |
| Solvent | |
| diglyme | 33.96 |
| anisole | 11.31 |

This antihalation composition was examined to determine the curing temperature necessary to render a film layer of the composition insoluble in aqueous developer. The solution was spin coated at 4000 r.p.m. onto seven vapor-primed (HMDS vapor, room temperature and pressure, 3 minutes) 4 inch silicon wafers. These wafers were softbaked for 60 seconds on a vacuum hotplate, each wafer baked at different temperatures, specifically each wafer was baked at 20° C. temperature increments in a range of from 80–200° C. Film thickness was determined from seven measurements on a Nanometrics Nanospec 215 using a refractive index of 1.64. The seven wafers were batch-developed for 60 seconds in room temperature Microposit$^R$ MF-321 developer (an aqueous-tetramethylammonium hydroxide (TMAH) solution available from Shipley Co., Newton, Mass.) at a normality of 0.21 and then again measured for film thickness again, as described above using a Nanospec 215. It was found that a bake temperature of 120° C. or greater was sufficient to crosslink the antihalation coating layer so as to make it insoluble in the 0.21 N TMAH developer.

EXAMPLE 2

The antihalation composition of Example 1 was tested for absorbance in the deep U.V. region. The composition was spin-coated at 3000 r.p.m. onto a 3-inch quartz wafer and softbaked at 120° C. for 60 seconds on a vacuum hotplate. Thickness was estimated by coating a 4 inch silicon wafer under the same conditions and measuring its thickness on a Nanospec 215, as described in Example 1 above. The coated wafer was analyzed on a Hewlett-Packard HP8452A UV-Visible Spectrophotometer and then corrected for the absorbance of the quartz wafer. At an exposure wavelength of 248 nm, the formulation was found to have an absorbance of 1.371 absorbance units per micron of thickness.

EXAMPLE 3

The antihalation composition of Example 1 was coated at 3000 r.p.m. onto 4 vapor-primed (HMDS, by procedures described in Example 1) 4 inch silicon wafers; the wafers were softbaked for 60 seconds on a vacuum hotplate. Two wafers were baked at 140° C., and the other two wafers were baked at 160° C. The four wafers were then each overcoated with Megaposit SNR248-1.0 deep UV photoresist (an acid-hardening photoresist sold by the Shipley Co.), using a 30 second spin at 3660 r.p.m., followed by a 60 second softbake at 90° C. on a vacuum hotplate in order to generate a resist layer thickness of approximately 1.025 microns. The wafers were exposed on a GCA Laserstep excimer laser stepper operating at the wavelength of 248 nm; an 8×8 array of patterns was utilized, covering a wide range of both exposure and focus to ensure that the optimum exposure was attained. The wafers were split up into two groups, each group containing one coated wafer cured at 140° C., and another coated wafer cured at 160° C.; one group of wafers was processed with a 60 second vacuum hotplate post-exposure bake at 110° C. while the other group was baked at 140° C. All of the wafers were developed with 0.14 N TMAH MF-319 developer (Shipley Co.) in double puddle mode, using 25 and 50 second puddles and a total developer contact time of 100' seconds. Well resolved lines/spaces (including lines having essentially vertical sidewalls) of down to 0.34 μm were patterned on the antihalation coating layer.

EXAMPLE 4

Another preferred antihalation composition was prepared by mixing the components set forth below, with component amounts expressed as parts by weight:

| Component | Amount |
|---|---|
| Resin binder | |
| Novolak | 3.462 |
| Crosslinker material | |
| Ethylated/methylated benzoguanamine-formaldehyde resin (sold under the tradename Cymel 1123 by American Cyanamid) | 1.039 |
| Solvent | |
| Diethyleneglycoldimethylether | 25.500 |

This antihalation composition was spin coated at 4600 r.p.m. onto vapor-primed (HMDS, room temperature and pressure, 3 minutes) 4 inch silicon wafers and unprimed 4 inch quartz wafers; each wafer was softbaked at 125° C. for 60 seconds on a vacuum hotplate. The wafers were then baked for 30 minutes in a Blue M convection oven. Thickness analysis of the antihalation composition coated silicon wafers on a Nanometrics Nanospec 215 showed an average film thickness of 1733 angstroms. The quartz wafers were analyzed on a Cary3 UV-Visible Spectrophotometer; after correcting for the absorbance of the quartz wafer, the absorbance of the 1733 angstroms thick antihalation coated quartz wafer was found to be 0.719 (absorbance units) at the wavelength of 248 nm. Next, one coated silicon wafer was overcoated with Megaposit$^R$ SNR248-1.0 photoresist, and another coated silicon wafer was overcoated with Microposit$^R$ XP-89131 photoresist, both said photoresists available from the Shipley Co. The coating of the Megaposit SNR248 resist required a 30 second spin at 3680 r.p.m. and a 60 second softbake at 90° C. on a vacuum hotplate in order to generate a thickness of approximately 1.014 microns, whereas the Microposit XP-89131 resist utilized a 3760 r.p.m. spin and a 110° C. softbake temperature to achieve a coating layer thickness 1.017 microns. The two wafers were exposed on a GCA Laserstep excimer laser stepper operating at the wavelength of 248 nm; a 7-by-15 array of patterns was utilized, covering a wide range of both exposure and focus to ensure that the optimum exposure was attained. All of the wafers were post-exposure baked at 130° C. for 60 seconds on a vacuum hotplate and then developed with XP-89114 developer aqueous (TMAH developer available from the Shipley Co.) in double puddle mode, using 25 and 50 second puddles and a total developer contact time of 100 seconds. Well-resolved lines/spaces (including lines having essentially vertical sidewalls) of down to 0.36 μm were patterned on the antihalation coating layer.

The foregoing description of the invention is merely illustrative thereof, and it is understood that variations and modifications can be effected without departing from the scope or spirit of the invention as set forth in the following claims.

What is claimed is:

1. A coated substrate comprising:

a substrate having thereon;

a layer of a coating composition comprising a melamine material;

a layer of a chemically-amplified positive photoresist composition above the coating composition comprising a melamine material.

2. The substrate of claim 1 wherein the coating composition comprising a melamine material is crosslinked.

3. The substrate of claim 1 wherein the coating composition comprises a thermal acid generator.

4. The substrate of claim 1 wherein the coating composition comprises an anthracene material.

5. The substrate of claim 1 wherein the substrate is a microelectronic wafer.

6. A method for forming a photoresist relief image comprising:

applying on a substrate a layer of a coating composition comprising a melamine material;

applying a layer of chemically-amplified positive photoresist composition above the coating composition comprising a melamine material.

7. The method of claim 6 wherein the coating composition comprising a melamine material is crosslinked.

8. The method of claim 6 wherein the coating composition comprises a thermal acid generator.

9. The method of claim 6 wherein the coating composition comprises an anthracene material.

10. The method of claim 6 wherein the substrate is a microelectronic wafer.

11. The method of claim 6 wherein the photoresist composition is imaged with activating radiation and the imaged photoresist composition is treated with a developer to provide a photoresist relief image.

12. The method of claim 11 wherein areas bared of photoresist upon treatment with the developer are etched.

13. The method of claim 11 wherein areas bared of photoresist upon treatment with the developer are exposed to plasma gas.

* * * * *